United States Patent [19]
Meixner et al.

[11] Patent Number: 5,744,248
[45] Date of Patent: Apr. 28, 1998

[54] COATING COMPOSITIONS CURABLE BY RADIATION AND THEIR USE FOR PREPARING COATED SUBSTRATES

[75] Inventors: Jürgen Meixner, Krefeld; Wolfgang Fischer, Meerbusch; Manfred Müller, Mönchengladbach; Günter Ruf, Krefeld, all of Germany

[73] Assignee: Bayer Aktiengesellschaft, Leverkusen, Germany

[21] Appl. No.: 789,047

[22] Filed: Jan. 28, 1997

[30] Foreign Application Priority Data

Feb. 6, 1996 [DE] Germany ............... 196 04 185.6

[51] Int. Cl.[6] ............................................. C08L 67/08
[52] U.S. Cl. ....................... 428/482; 525/7; 525/7.1; 522/40; 522/43; 522/104; 522/179
[58] Field of Search ................................ 522/179, 104, 522/40, 43; 428/482; 525/7, 7.1

[56] References Cited

U.S. PATENT DOCUMENTS

| | | |
|---|---|---|
| 3,882,006 | 5/1975 | Watanabe ................................. 525/7 |
| 4,077,925 | 3/1978 | Sattler ..................................... 525/7 |
| 5,039,740 | 8/1991 | Anderson ................................. 525/7 |

FOREIGN PATENT DOCUMENTS

| | | |
|---|---|---|
| 3803141 | 8/1989 | Germany. |
| 62-129364 | 6/1987 | Japan. |

*Primary Examiner*—Patricia A. Short
*Attorney, Agent, or Firm*—Joseph C. Gil; Thomas W. Roy

[57] ABSTRACT

The present invention relates to coating compositions, which are curable by radiation and contain I) 0 to 95 parts by weight of at least one binder curable by radiation and containing maleate, fumarate and/or acryloyl groups other than those of component II), II) 5 to 100 parts by weight of a mixture of
  A) 20 to 80 parts by weight of at least one polyester resin prepared from fatty acids, provided that at least 20 wt. % of component A) is a fatty acid having a number average molecular weight of 112 to 400 and
  B) 20 to 80 parts by weight of compounds containing (meth)acryloyl groups, having a viscosity at 23° C. of 10 to 1,000 mPa.s and having a number average molecular weight of 170 to 1,000, wherein the sum of the parts by weight of components I) and II) adds up to 100, based on the weight of components I) and II), and the sum of the parts by weight of components A) and B) adds up to 100, based on the weight of components A) and B).

2 Claims, No Drawings

COATING COMPOSITIONS CURABLE BY RADIATION AND THEIR USE FOR PREPARING COATED SUBSTRATES

BACKGROUND OF THE INVENTION

1. Field of the Invention

The present invention relates to new lacquer compositions curable by radiation, their use for coating various substrates and the resulting coatings, which exhibit excellent adhesion.

2. Description of the Prior Art

Binders employed for coating compositions curable by radiation are usually substantially based on unsaturated polyester resins containing maleate and/or fumarate groups or unsaturated acrylic resins containing acryloyl groups.

Polyester resins modified by fatty acids (alkyd resins) are cross-linked either by autoxidation or by reaction with melamine resins or with polyisocyanates.

DE-A 3,803,141 describes coating compositions based on ethylenically unsaturated, polymeric binders, which may also be alkyd resins, and on low molecular weight unsaturated compounds. These are cross-linked through drying by autoxidation catalyzed with metallic drying agents.

Finally, JP-A 62 129 364/85 describes particular saturated polyesters, which are dissolved in (meth)acrylic acid monomers and are said to be cross-linkable by radiation. These binders are not suitable for use, for example, as wood coatings, because they do not possess sufficient reactivity.

A problem in all radically curable coatings is the poor adhesion to certain substrates such as teak, printing inks, melamine sheets and metals.

It is an object of the present invention to provide radiation curing coatings which possess improved adhesion to these substrates and also cure at an acceptable rate.

This object may be achieved with the compositions according to the present invention. These compositions, which are based on mixtures of polyester resins containing fatty acids and low viscosity compounds containing (meth) acryloyl groups, cure very satisfactorily when irradiated and also result in coatings which exhibit excellent adhesion even when applied to the above-mentioned difficult substrates.

These mixtures may also be added to the conventional materials curable by radiation and thereby also improve the adhesive properties of these binders.

SUMMARY OF THE INVENTION

The present invention relates to coating compositions, which are curable by radiation and contain I) 0 to 95 parts by weight of at least one binder curable by radiation and containing maleate, fumarate and/or acryloyl groups other than those of component II), II) 5 to 100 parts by weight of a mixture of
  A) 20 to 80 parts by weight of at least one polyester resin prepared from fatty acids, provided that at least 20 wt. % of component A) is a fatty acid having a number average molecular weight of 112 to 400 and
  B) 20 to 80 parts by weight of compounds containing (meth)acryloyl groups, having a viscosity at 23° C of 10 to 1,000 mPa.s and having a number average molecular weight of 170 to 1,000, wherein the sum of the parts by weight of components I) and II) adds up to 100, based on the weight of components I) and II), and the sum of the parts by weight of components A) and B) adds up to 100, based on the weight of components A) and B).

III) Optionally further additives known from the technology of polyester resins.

DETAILED DESCRIPTION OF THE INVENTION

Binders used as component I) are selected from those containing maleate and/or fumarate groups (unsaturated polyester resins), such as those described in DE-A 1,694,149, and/or acryloyl groups, such as those described in R. Holman, P. Oldring (Editors) "UV+EB Curing Formulations for Printing Inks, Coatings and Paints", Sita Technologie, London, 1988.

Polyester resins containing fatty acids (alkyd resins), which may optionally contain urethane groups, are used as component A). Fatty acids are defined as saturated or unsaturated, straight chain or branched aliphatic monocarboxylic acids.

The polyester resins may be prepared by the known reaction of carboxylic acids a) and alcohols b), optionally in presence of known esterification catalysts. The reaction is preferably carried out by melt condensation or azeotropic condensation, optionally with application of a vacuum, at temperatures of 140 to 270° C. and with elimination of water.

Suitable carboxylic acids a) for the esterification reaction include saturated and/or olefinically unsaturated, aliphatic monocarboxylic acids having 2 to 22, preferably 6 to 20 carbon atoms; saturated and/or olefinically unsaturated cycloaliphatic monocarboxylic acids having 6 to 15, preferably 7 to 10 carbon atoms; aromatic monocarboxylic acids having 7 to 15, preferably having 7 to 11 carbon atoms; saturated and/or olefinically unsaturated aliphatic polycarboxylic acids having 4 to 12, preferably 4 to 8 carbon atoms; saturated and/or olefinically unsaturated cycloaliphatic polycarboxylic acids having 6 to 15, preferably 8 carbon atoms; aromatic polycarboxylic acids corresponding to these cycloaliphatic carboxylic acids; and/or the anhydrides of the polycarboxylic acids capable of intramolecular anhydride formation.

Examples include monocarboxylic acids such as acetic acid, propionic acid, butyric acid, valeric acid, hexanoic acid, octanoic acid, nonanoic acid, decanoic acid, lauric acid, myristic acid, palmitic acid, stearic acid, eicosanoic acid, docosanoic acid, acrylic acid, crotonic acid, ricinoleic acid, benzoic acid, hexahydrobenzoic acid, tetrahydrobenzoic acid, abietic acid, cinnamic acid and 1-naphthyl acid; polycarboxylic acids such as maleic acid, maleic anhydride, fumaric acid, succinic acid, oxalic acid, adipic acid, phthalic acid, phthalic anhydride, isophthalic acid, terephthalic acid, tetrahydrophthalic acid, tetrahydrophthalic anhydride, hexahydrophthalic acid, hexahydrophthalic anhydride, 1,4-cyclohexanedicarboxylic acid, glutaric acid, pimelic acid, suberic acid, azelaic acid, sebacic acid, sorbic acid, nonanedicarboxylic acid, decanedicarboxylic acid, undecanedicarboxylic acid, norbornenedicarboxylic acid, malic acid, tartaric acid, trimellitic acid, trimellitic anhydride, pyromellitic acid and pyromellitic anhydride; and mixtures of any of the preceding acids.

The mixtures of fatty acids originating from natural sources, which can also be used in technically prepared and modified form, are particularly suitable. Examples of these include castor oil fatty acid, coconut oil fatty acid, cottonseed oil fatty acid, rapeseed oil fatty acid, soy bean oil fatty acid, sunflower oil fatty acid, peanut oil fatty acid, tall oil fatty acid, tallow fatty acid, herring oil fatty acid or whale oil fatty acid, which can be used as natural and/or synthetic mixtures or with polyols as transesterification products.

Component A) contains 20 to 80 wt. %, preferably 25 to 80 wt. %, of a fatty acid having a number average molecular weight of 112 to 400, preferably 144 to 340.

Suitable alcohols b) for the esterification reaction include aliphatic or cycloaliphatic diols such as ethylene glycol, 1,3- and 1,2-propylene glycol, 1,4-, 1,3- and 2,3-butanediol, 1,6-hexanediol, diethylene glycol, triethylene glycol, 1,8-octanediol, hydrogenated bisphenols, 1,4-cyclo-hexanediol, 1,4-cyclohexanedimethanol and neopentyl glycol.

Higher functional polyol components containing at least one trihydric or tetrahydric alcohol having a number average molecular weight of 92 to 700 are particularly suitable. Examples of suitable higher functional alcohols include glycerol, trimethylolpropane and pentaerythritol or the alkoxylated derivatives thereof. Mixtures of diols and polyols can also be used.

In the case of an azeotropic esterification of the components the entraining agent, usually isooctane, xylene, toluene or cyclohexane, is distilled off in a vacuum on completion of the reaction.

If required, a urethanization reaction may also follow the esterification reaction. For this the polyester formed, which possess free OH groups, is reacted with isocyanate in a known addition reaction. Examples of suitable isocyanates include tolylene diisocyanate, hexamethylene diisocyanate and isophorone diisocyanate.

Compounds B) containing (meth)acryloyl groups are compounds which have a number average molecular weight of 170 to 1,000 and contain (meth)acrylate groups. Examples include the (meth)acrylic esters of ethylene glycol, propylene glycol, dipropylene glycol, butanediol, hexanediol, glycerol, trimethylolpropane, pentaerythritol, sorbitol, and the corresponding (meth)acrylic esters of the polyether alcohols corresponding to these alcohols. The polyether alcohols can be obtained in known manner by the alkoxylation of the preceding alcohols using propylene oxide and/or ethylene oxide.

The weight ratio of components I):II) is 0:100 to 95:5, preferably 0:100.

The weight ratio of components A):B) is 20:80 to 80:20, preferably 30:70 to 70:30.

The coating compositions according to the invention may also contain known additives III), such as fillers, pigments, dyes, thixotropic agents, drying agents, solvents, levelling agents, flatting agents and flow-control agents, which may be added in known quantities.

The invention also relates to the use of the coating compositions for coating various substrates such as paper, cardboard packaging, leather, wood, plastics, fleece, textiles, ceramic materials and photographic materials (e.g., paper covered with a photographic layer). Preferred substrates are wood, printing inks, plastics sheets and metals.

In the use according to the invention the curing, optionally after vaporization of volatile additives, such as inert solvents, is carried out by means of energy-rich radiation, such as electron beams, gamma rays or preferably UV light (180 to 300 nm). When cured by UV radiation, it is necessary to add photoinitiators to the coating compositions.

Suitable photoinitiators are known and described, for example, in Houben-Weyl, Methoden der organischen Chemie, Volume E 20, page 80 ff., Georg Thieme Verlag, Stuttgart, 1987. Examples include benzoin ethers such as benzoin isopropyl ether, benzil ketals such as benzil dimethyl ketal and hydroxyalkylphenones such as 1-phenyl-2-hydroxy-2-methylpropan-1-one.

Depending upon the intended use of the products according to the invention, the photoinitiators are added in quantities of 0.5 to 10 wt. %, preferably 1 to 8 wt. %, based on the total weight of components I)+II). The photoinitiators can be used as individual substances or, to obtain advantageous synergistic effects, in combination with one another.

EXAMPLES

In the following examples, all parts and percentages are by weight unless otherwise indicated.
General instructions for the preparation of polyester resins modified by fatty acids (component A)

The raw materials set forth in Table 1 were heated to 250° C. under passage of nitrogen and maintained at this temperature until a viscosity (60% in xylene) of about 1000 mPa.s (DIN 53019, 23° C.) was attained. The mixture was cooled to 110° C. and then 0.03%, based on solids, of toluhydroquinone (stabilizer) was added.

TABLE I

| Component A) | A1 | A2 | A3 | A4 | A5 | A6 |
|---|---|---|---|---|---|---|
| Starting materials wt. % | | | | | | |
| Phthalic anhydride | 26.3 | 26.2 | 26.3 | 28.6 | 40.4 | 41.5 |
| Benzoic acid | 12.2 | 12.1 | 12.2 | 20.1 | | 13.0 |
| Soy bean oil fatty acid | 46.5 | | | 35.0 | 32.6 | 15.6 |
| Sunflower oil fatty acid | | 46.7 | | | | |
| Peanut oil fatty acid | | | 46.5 | | | |
| Pentaerythritol | 23.0 | 22.9 | 23.0 | 25.0 | | |
| Trimethylolpropane | | | | | 34.0 | 36.8 |
| Characteristic values | | | | | | |
| Acid number (mg KOH/g substance) | 4 | 6 | 4 | 14 | 11 | 16 |
| Viscosity, 60% in xylene (mPa · s/ 23° C./DIN 53019) | 1050 | 980 | 1010 | 990 | 1300 | 1125 |

II. Production and use of the coating compositions according to the invention

Coating compositions were prepared by mixing 40 parts by weight of components A1 to A5, respectively, with 60 parts by weight of dipropylene glycol diacrylate and 5 parts by weight of 1-phenyl-2-hydroxy-2-methylpropan-1-one (photoiniator).

The coating compositions were applied to a) colored printed cardboard (30 μm applied thickness), b) teak veneer (60 μm applied thickness) and c) metal sheet (Bonder WH 60 OC/40 μm applied thickness), and passed under a Hanovia radiator (80 W/cm, 10 cm distance).

The coatings on substrates a) and b) were cured at a conveyor speed of 5 m/min, and the coating on substrate c) was cured at a conveyor speed of 1 m/min, to form solvent-resistant and scratch-resistant coatings, which exhibit an excellent adhesion to the respective substrate.

In this case, solvent resistance means that the coated film appeared flawless after at least 20 double rubs using a cloth soaked in butyl acetate under a load of 1 kg. The scratch-resistance was tested by means of a fingernail.

To assess the adhesion of the coating, a cross-cut adhesion test was performed by cutting a grid of 6×6 lines each at a distance apart of 1 mm in the coating layer, then pressing an adhesive tape thereto and rapidly removing it.

III. Comparative example

A coating composition was prepared by mixing 40 parts by weight of component A6, which contained a quantity of fatty acid not according to the invention, with 60 parts by weight of dipropylene glycol diacrylate and 5 parts by weight of 1-phenyl-2-hydroxy-2-methylpropan-1-one (photoiniator).

As in the examples according to the invention the coating composition was applied to a) a) colored printed cardboard (30 μm applied thickness),
b) teak veneer (60 μm applied thickness) and
c) metal sheet (Boner WH 60 OC / 40 μm applied thickness), and passed under a Hanovia radiator (80 W/cm, 10 cm distance).

The coatings on substrates a) and b) are cured at a conveyor speed of 5 m/min, and the coating on substrate c) was cured at a conveyor speed of 1 m/min, to form coatings, in which the solvent-resistance and scratch-resistance were considerably worse than those in the Examples according to the invention. The coverings do not adhere at all to the substrates.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A coating composition, which is curable by UV radiation and contains

I) 0 to 95 parts by weight of at least one binder curable by radiation and containing maleate, fumarate and/or acryloyl groups other than those of component II), II) 5 to 100 parts by weight of a mixture of
  A) 20 to 80 parts by weight of at least one polyester resin prepared from fatty acids, provided that at least 20 wt. % of component A) is a fatty acid having a number average molecular weight of 112 to 400 and the acid component used to prepare the polyester consists of said fatty acids and a member selected from the group consisting of aromatic monocarboxylic acids containing 7 to 15 carbon atoms, aromatic polycarboxylic acids containing 6 to 15 carbon atoms and their intramolecular anhydrides, and
  B) 20 to 80 parts by weight of at least one compound containing (meth)acryloyl groups, having a viscosity at 23° C. of 10 to 1,000 mPa.s and having a number average molecular weight of 170 to 1,000, and III) 0.5 to 10 wt. %, based on the total weight of components I) and II), of a photoinitiator, wherein the sum of the parts by weight of components I) and II) adds up to 100, based on the weight of components I) and II), and the sum of the parts by weight of components A) and B) adds up to 100, based on the weight of components A) and B).

2. A substrate coated with the coating composition of claim 1.

* * * * *